United States Patent
Okuyama

(10) Patent No.: US 11,195,716 B2
(45) Date of Patent: Dec. 7, 2021

(54) METHOD OF PRODUCING SEMICONDUCTOR EPITAXIAL WAFER AND METHOD OF PRODUCING SEMICONDUCTOR DEVICE

(71) Applicant: SUMCO CORPORATION, Tokyo (JP)

(72) Inventor: Ryosuke Okuyama, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/966,291

(22) PCT Filed: Jan. 8, 2019

(86) PCT No.: PCT/JP2019/000239
§ 371 (c)(1),
(2) Date: Jul. 30, 2020

(87) PCT Pub. No.: WO2019/167430
PCT Pub. Date: Sep. 6, 2019

(65) Prior Publication Data
US 2020/0373158 A1    Nov. 26, 2020

(30) Foreign Application Priority Data
Feb. 27, 2018    (JP) .............................. JP2018-033818

(51) Int. Cl.
*H01L 21/02* (2006.01)
*H01L 21/265* (2006.01)

(52) U.S. Cl.
CPC .. *H01L 21/02658* (2013.01); *H01L 21/02381* (2013.01); *H01L 21/26506* (2013.01); *H01L 21/26566* (2013.01)

(58) Field of Classification Search
None
See application file for complete search history.

(56) References Cited

U.S. PATENT DOCUMENTS

| 2009/0206281 | A1 | 8/2009 | Oved et al. |
| 2010/0084577 | A1 | 4/2010 | Hatem et al. |

(Continued)

FOREIGN PATENT DOCUMENTS

| JP | 2009-540535 A | 11/2009 |
| JP | 2012-505550 A | 3/2012 |

(Continued)

OTHER PUBLICATIONS

ISR for PCT/JP2019/000239, dated Feb. 26, 2019.
(Continued)

*Primary Examiner* — Alexander G Ghyka
(74) *Attorney, Agent, or Firm* — Greenblum & Bernstein, P.L.C.

(57) ABSTRACT

The method of producing a semiconductor epitaxial wafer includes: a first step of irradiating a surface of a semiconductor wafer with cluster ions containing carbon, phosphorus, and hydrogen as constituent elements to form a modified layer that is located in a surface layer portion of the semiconductor wafer and that contains the constituent elements of the cluster ions as a solid solution; and a second step of forming an epitaxial layer on the modified layer of the semiconductor wafer. The ratio y/x of the number y of the phosphorus atoms with respect to the number x of the carbon atoms satisfies 0.5 or more and 2.0 or less, where the number of atoms of carbon, phosphorus, and hydrogen in the cluster ions is expressed by $C_xP_yH_z$ (x, y, and z are integers each equal to or more than 1).

5 Claims, 7 Drawing Sheets

(56) References Cited

U.S. PATENT DOCUMENTS

| | | | |
|---|---|---|---|
| 2013/0299954 A1* | 11/2013 | Kitada | .................. H01L 21/187 |
| | | | 257/655 |
| 2016/0181311 A1 | 6/2016 | Kadono et al. | |
| 2016/0315117 A1* | 10/2016 | Okuyama | ......... H01L 27/14687 |
| 2017/0256668 A1* | 9/2017 | Okuyama | ........... H01L 27/1464 |
| 2017/0352545 A1* | 12/2017 | Hirose | ............. H01L 21/02532 |
| 2018/0374891 A1* | 12/2018 | Kadono | ............ H01L 21/02532 |
| 2019/0027533 A1* | 1/2019 | Okuyama | ........... H01L 27/1464 |
| 2020/0127043 A1 | 4/2020 | Kadono et al. | |
| 2021/0050451 A1* | 2/2021 | Lin | ....................... H01L 21/324 |

FOREIGN PATENT DOCUMENTS

| | | |
|---|---|---|
| JP | 2014-099482 A | 5/2014 |
| JP | 2016-051729 A | 4/2016 |
| TW | 201423969 A | 6/2014 |
| WO | WO 2016/031328 A1 | 3/2016 |

OTHER PUBLICATIONS

IPRP for PCT/JP2019/000239, dated Aug. 27, 2020 (w/ translation).
Office Action in Taiwanese Patent Application No. 108102481, dated Jul. 11, 2019 (w/ translation).
Office Action for KR App. No. 10-2020-7013737, dated Oct. 5, 2021 (w/ translation).

* cited by examiner

METHOD OF PRODUCING SEMICONDUCTOR EPITAXIAL WAFER AND METHOD OF PRODUCING SEMICONDUCTOR DEVICE

TECHNICAL FIELD

This disclosure relates to a method of producing a semiconductor epitaxial wafer and a method of producing a semiconductor device.

BACKGROUND

Semiconductor epitaxial wafers in which an epitaxial layer is formed on a semiconductor wafer typified by a silicon wafer are used as device substrates for producing various semiconductor devices such as metal oxide semiconductor field-effect transistors (MOSFETs), dynamic random access memories (DRAMs), power transistors, and back-illuminated solid-state image sensing devices.

In recent years, for example, back-illuminated solid-state image sensing devices can directly receive light from the outside and take sharper images or motion pictures even in dark places and the like due to the fact that a wiring layer and the like thereof are disposed at a lower layer than a sensor unit. Accordingly, back-illuminated solid-state image sensing devices are widely used in digital video cameras and mobile phones such as smartphones.

As semiconductor devices are increasingly developed to be miniaturized and to have higher performance in recent years, semiconductor epitaxial wafers used as device substrates are required to have higher quality in order to improve the device characteristics.

In view of this, the applicant of this application proposed a method of producing a semiconductor epitaxial wafer including a first step of irradiating the surface of the semiconductor wafer with cluster ions including hydrogen as a constituent element, such as $C_3H_5$; and a second step of forming an epitaxial layer on the surface of the semiconductor wafer after the first step, in which in the first step, a beam current of the cluster ions 16 is 50 μA or more. The technique disclosed in PTL 1 is summarized below.

First, hydrogen ions are implanted in the form of monomer ions into a semiconductor wafer to form a hydrogen ion-implanted region in a surface layer portion of the semiconductor wafer, and for a semiconductor epitaxial wafer in which an epitaxial layer is formed on the surface layer portion after that, when the hydrogen concentration profile of the surface layer portion in the depth direction is measured by secondary ion mass spectrometry (SIMS), the hydrogen concentration is not higher than the detection limit and no hydrogen concentration peak is observed. Since hydrogen is a lightweight element, hydrogen is diffused outward due to heat caused in the formation of the epitaxial layer, and little hydrogen remains in the semiconductor wafer.

In PTL 1, when hydrogen is implanted in the form of cluster ions like $C_3H_5$ ions, and the beam current is set to 50 μA or more, hydrogen can be made to remain at a high concentration in the surface layer portion of the semiconductor wafer even after the epitaxial layer is formed and a semiconductor epitaxial wafer in which a peak of the hydrogen profile in the depth direction is in the surface layer portion is produced. Hydrogen remaining in the surface layer portion of the semiconductor wafer (that is, immediately under the epitaxial layer) is diffused into the epitaxial layer by heat treatment performed in the device formation process for forming a semiconductor device in the epitaxial layer, and passivates defects in the epitaxial layer. Accordingly, when the semiconductor epitaxial wafer of PTL 1 is used in a device formation process, the crystallinity of an epitaxial layer is increased, and the device characteristics are expected to be improved.

CITATION LIST

Patent Literature

PTL 1: WO 2016/031328 A

SUMMARY

Technical Problem

Hydrogen remaining in the surface layer portion of the semiconductor wafer makes interface state density defects in the epitaxial layer inactive during the device formation process, which contributes to the improvement in the device characteristics, for example, reduction in the leakage current. However, further studies made by the inventor of this disclosure revealed that there was room for improvement in terms of the following points in PTL 1. PTL 1 describes that when the semiconductor epitaxial wafer is subjected to heat treatment simulating a high temperature device formation process for example at a temperature of 1100° C. for 30 minutes, the epitaxial layer has high crystallinity. However, it was found that in the case of low temperature heat treatment of 700° C. or less, hydrogen trapped in the surface layer portion cannot be sufficiently diffused or supplied to the epitaxial layer. In recent years, the temperature in device formation processes has been increasingly lowered, and defects in the epitaxial layer are desired to be passivated by sufficiently diffusing, in the epitaxial layer, the hydrogen trapped in the surface layer portion even when a low temperature device formation process is performed.

In view of the above challenges, it could be helpful to provide a method of producing a semiconductor epitaxial wafer, which makes it possible to produce a semiconductor epitaxial wafer allowing for a sufficient passivation effect of hydrogen in an epitaxial layer even when the semiconductor epitaxial wafer is subjected to a low temperature device formation process; and a method of producing a semiconductor device using the method of producing a semiconductor epitaxial wafer.

Solution to Problem

The inventor made diligent studies to address the above challenges and found the following. That is, when cluster ions containing carbon, phosphorus, and hydrogen as constituent elements and having a ratio of the number of phosphorus atoms with respect to the number of carbon atoms of 0.5 or more and 2.0 or less are used, the hydrogen concentration profile in the semiconductor wafer surface layer portion in the depth direction after the formation of an epitaxial layer exhibits a shape having a peak that can be separated into two peaks using the Lorentzian function. While hydrogen forming the first peak closer to the epitaxial layer diffuses due to high temperature heat treatment as in conventional techniques, little hydrogen diffuses during low temperature heat treatment; however, hydrogen forming the second peak farther from the epitaxial layer was found to sufficiently diffuse during heat treatment at a temperature of 700° C. which is lower than the temperature in convention techniques.

This disclosure completed based on the above findings primarily includes the following features.

(1) A method of producing a semiconductor epitaxial wafer, the method comprising:

a first step of irradiating a surface of a semiconductor wafer with cluster ions containing carbon, phosphorus, and hydrogen as constituent elements to form a modified layer that is located in a surface layer portion of the semiconductor wafer and that contains the constituent elements of the cluster ions as a solid solution; and a second step of forming an epitaxial layer on the modified layer of the semiconductor wafer, wherein a ratio y/x of the number y of the phosphorus atoms with respect to the number x of the carbon atoms satisfies 0.5 or more and 2.0 or less, where the number of atoms of carbon, phosphorus, and hydrogen in the cluster ions is expressed by $C_xP_yH_z$ where x, y, and z are integers each equal to or more than 1.

(2) The method of producing a semiconductor epitaxial wafer, according to (1) above, wherein x is 1 or more and 3 or less, y is 1 or more and 3 or less, and z is 1 or more and 12 or less.

(3) The method of producing a semiconductor epitaxial wafer, according to (1) or (2) above, wherein in the first step, a beam current of the cluster ions is 50 µA or more and 5000 µA or less.

(4) The method of producing a semiconductor epitaxial wafer, according to any one of (1) to (3) above, wherein the semiconductor wafer is a silicon wafer.

(5) A method of producing a semiconductor device, the method comprising forming a semiconductor device in the epitaxial layer of the semiconductor epitaxial wafer produced by the producing method according to any one of (1) to (4) above.

Advantageous Effect

The method of producing a semiconductor epitaxial wafer, according to this disclosure can produce a semiconductor epitaxial wafer allowing for a sufficient passivation effect of hydrogen in an epitaxial layer even when the semiconductor epitaxial wafer is subjected to a low temperature device formation process. The method of producing a semiconductor device, according to this disclosure allows for a sufficient passivation effect of hydrogen in an epitaxial layer even in the case of a low temperature device formation process.

DETAILED DESCRIPTION

Embodiments of this disclosure will now be described in detail with reference to the drawings. Note that in FIG. 1, the thicknesses of a modified layer 14 and an epitaxial layer 18 are exaggerated relative to that of a semiconductor wafer 10 for convenience of description and thus the ratio of the thicknesses differs from the actual ratio.

(Method of Producing Semiconductor Epitaxial Wafer)

Figure 1:
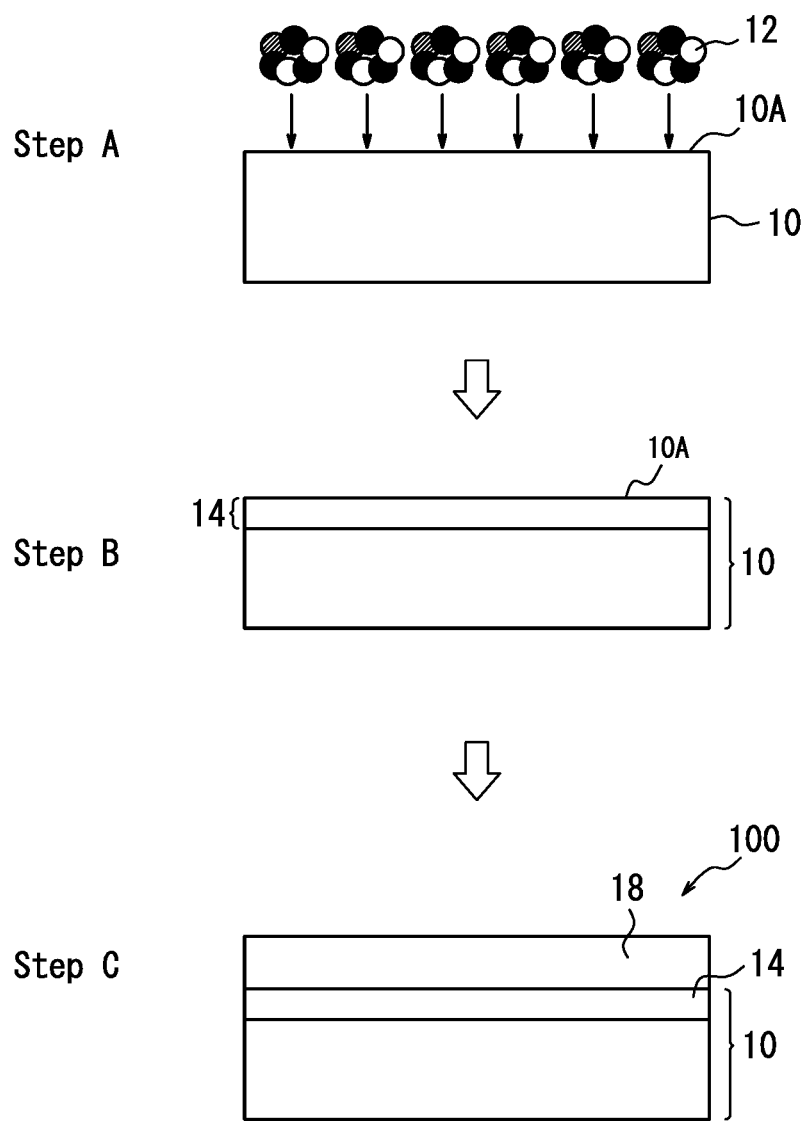
FIG. 1 presents cross-sectional views schematically illustrating steps of a method of producing a semiconductor epitaxial wafer 100, according to one embodiment of this disclosure.

As illustrated in FIG. 1, a method of producing a semiconductor epitaxial wafer 100, according to an embodiment of this disclosure includes: a first step (steps A and B in FIG. 1) of irradiating a surface 10A of a semiconductor wafer 10 with cluster ions 12 containing carbon, phosphorus, and hydrogen as constituent elements to form a modified layer 14 that is located in a surface layer portion of the semiconductor wafer 10 and that contains the constituent elements of the cluster ions 12 as a solid solution; and a second step (step C in FIG. 1) of forming an epitaxial layer 18 on the modified layer 14 of the semiconductor wafer 10. The epitaxial layer 18 forms a device layer for producing a semiconductor device such as a back-illuminated solid-state image sensing device.

[First Step]

The semiconductor wafer 10 is for example a bulk single crystal wafer that is made of silicon or a compound semiconductor (GaAs, GaN, or SiC) and that does not have an epitaxial layer at the surface. When a back-illuminated solid-state image sensing device is produced, a bulk single crystal silicon wafer is typically used. Further, the semiconductor wafer 10 used can for example be obtained by growing a single crystal silicon ingot by the Czochralski process (CZ process) or the floating zone melting process (FZ process) and slicing the ingot using a wire saw or the like. Further, carbon and/or nitrogen may be added to the semiconductor wafer 10 to achieve higher gettering capability. Furthermore, a given dopant may be added to the semiconductor wafer 10 at a predetermined concentration to obtain an n+ type, p+ type, n– type, or p– type substrate.

Alternatively, the semiconductor wafer used may be an epitaxial wafer in which a semiconductor epitaxial layer is formed on the surface of a bulk semiconductor wafer. For example, the semiconductor wafer 10 may be an epitaxial silicon wafer in which a silicon epitaxial layer is formed on the surface of a bulk single crystal silicon wafer. The silicon epitaxial layer can be formed by CVD under typical conditions. The thickness of the epitaxial layer is preferably in a range of 0.1 μm to 20 μm, more preferably in a range of 0.2 μm to 10 μm. In this case, the semiconductor epitaxial wafer 100 has a plurality of epitaxial layers including the epitaxial layer 18 and an epitaxial layer of a semiconductor wafer not shown.

In the first step, the surface 10A of the semiconductor wafer 10 is irradiated with cluster ions 12 containing carbon, phosphorus, and hydrogen as constituent elements. In this specification, "cluster ions" are obtained by bombarding gaseous molecules with electrons to dissociate the bond of the gaseous molecules by electron impact ionization thereby forming aggregates of atoms having different number of atoms; ionizing the aggregates of atoms by causing fragmentation; subjecting the aggregates of atoms having different number of atoms having been ionized to mass separation; and extracting ionized aggregates of atoms having a certain mass number. Specifically, the cluster ions are obtained by ionization of clusters by giving positive charges or negative charges to the clusters formed by the aggregation of a plurality of atoms, and such cluster ions are clearly distinguished from monoatomic ions such as carbon ions and monomolecular ions such as carbon monoxide ions. The number of atoms constituting the cluster ions is usually around 5 to 100. As a cluster ion implanting system using such a theory, for example, CLARIS (a registered trademark in Japan, other countries, or both) manufactured by Nissin Ion Equipment Co., Ltd. can be used.

When a silicon wafer as the semiconductor wafer 10 is irradiated with cluster ions 12 containing carbon, phosphorus, and hydrogen; the irradiation energy instantaneously heats silicon to a high temperature of around 1350° C. to 1400° C. and thus the silicon melts. Subsequently, the silicon is rapidly cooled to form a solid solution of carbon, phosphorus, and hydrogen in the vicinity of the surface of the silicon wafer. Correspondingly, the "modified layer" herein means a layer in which the constituent elements of the cluster ions to be shot form a solid solution at crystal interstitial positions or substitution positions in the crystal lattice of the surface layer portion of the semiconductor wafer. Further, in the concentration profiles of carbon, phosphorus, and hydrogen in the depth direction of the semiconductor wafer, the modified layer is identified as an area in which at least one of the elements is detected at a higher concentration than the background; in most cases, the area is a surface layer portion of 500 nm or less from the surface of the semiconductor wafer.

Although the details will be described based on experimental results in Examples, in this embodiment, when the number of atoms of carbon, phosphorus, and hydrogen in the cluster ions 12 is expressed by $C_xP_yH_z$ (x, y, and z are integers each equal to or more than 1), it is important to use cluster ions having a ratio y/x of the number y of phosphorus atoms with respect to the number x of carbon atoms that satisfies 0.5 or more and 2.0 or less. This allows hydrogen to sufficiently remain in the modified layer 14 even after epitaxial growth to be described below (second step) and allows hydrogen trapped in the modified layer 14 to be diffused in the epitaxial layer 18 even in the case where heat treatment simulating a low temperature device formation process is performed. In terms of obtaining such an effect more reliably, the cluster ions 12 are preferably cluster ions including carbon, phosphorus, and hydrogen as constituent elements; namely, cluster ions of which the cluster size is expressed by $C_xP_yH_z$ (x, y, and z are integers each equal to or more than 1) are preferred.

The inventor believes that the mechanism allowing for such an effect is as follows; however, this disclosure is not limited to this.

First, as also described above in the BACKGROUND section, when hydrogen ions are implanted in the form of monomer ions (monoatomic ions) into the semiconductor wafer, even if a peak concentration of around $1\times10^{20}$ atoms/cm$^3$ is obtained in the hydrogen concentration profile in the depth direction of the surface layer portion in the semiconductor wafer immediately after the implantation, the peak disappears in the hydrogen concentration profile after the epitaxial growth, and the hydrogen concentration reaches the detection limit. Note that the detection limit of the hydrogen concentration is $7.0\times10^{16}$ atoms/cm$^3$ in the current detection techniques using SIMS.

By contrast, in this embodiment, a large amount of defects (damages) can be formed in the surface layer portion of the semiconductor wafer by irradiating the semiconductor wafer with hydrogen in the form of cluster ions. Consequently, although much of the hydrogen diffuses outward during heat treatment in epitaxial growth, hydrogen trapped in the defects in the surface layer portion remains in the surface layer portion even after the epitaxial growth. As a result, when hydrogen is implanted to a degree corresponding to a peak concentration of approximately $1\times10^{20}$ atoms/cm$^3$ immediately after the irradiation with the cluster ions, a peak having a peak concentration in the neighborhood of $1\times10^{18}$ atoms/cm$^3$ is found even in the hydrogen concentration profile after the epitaxial growth. The hydrogen remaining in the modified layer diffuses in the epitaxial layer due to heat treatment in the device formation process and passivates the defects in the epitaxial layer.

Further, in this embodiment, in the case of a cluster size of $C_xP_yH_z$, cluster ions having a ratio y/x satisfying 0.5 or more and 2.0 or less are used, thus a passivation effect of hydrogen can be sufficiently obtained in the epitaxial layer by diffusing a large amount of hydrogen remaining in the modified layer into the epitaxial layer even when the heat treatment is performed at a low temperature in the device formation process. This may be attributed to the following mechanism. That is, when certain cluster ions as described above are used, hydrogen remaining in the modified layer is divided into hydrogen remaining in the form of C—H$_2$ bonds in the modified layer and hydrogen remaining in the form of P—H bonds in the modified layer. Since the activation energy of the dissociation of the former hydrogen from the C—H$_2$ bonds is high, the former hydrogen is dissociated from the C—H$_2$ bonds and diffuses into the epitaxial layer in the case of a high temperature device formation process, whereas hydrogen is not dissociated from the C—H$_2$ bonds in the case of a low temperature device formation process. On the other hand, since the activation energy of the dissociation of the latter hydrogen from the P—H bonds is low, the latter hydrogen is dissociated from the P—H bonds and diffuses into the epitaxial layer even in the case of a low temperature device formation process. In fact, as will be described in Examples (see FIG. 3B), in this embodiment, the hydrogen concentration profile after the epitaxial growth was successfully separated by peak separation using the Lorentzian function into the first peak of hydrogen in the form of C—H$_2$ bonds and the second peak of hydrogen in the form of P—H bonds. When heat treatment was performed at 700° C. for 30 min simulating a low temperature device formation process, the peak concentration of the first peak was slightly reduced, whereas the peak concentration of the second peak was greatly reduced (see FIG. 4B).

When cluster ions having y/x of less than 0.5 are used, the ratio of phosphorus with respect to carbon is too low, so hydrogen in the form of P—H bonds hardly remains in the modified layer, and thus the concentration of hydrogen diffusing during the low temperature device formation process is not sufficient. Accordingly, a passivation effect of hydrogen in the epitaxial layer cannot sufficiently be obtained in the low temperature device formation process. Further, when cluster ions having y/x exceeding 2.0 are used, the ratio of phosphorus with respect to carbon is too high, thus implantation defects such as dislocation loops caused by phosphorus are formed in the modified layer. In that case, hydrogen is trapped in the implantation defects, and the trapped hydrogen does not diffuse during the low temperature device formation process. As a result, again, a passivation effect of hydrogen in the epitaxial layer cannot sufficiently be obtained in the low temperature device formation process. Accordingly, in this embodiment, cluster ions having y/x satisfying 0.5 or more and 2.0 or less are used.

The cluster ion irradiation conditions include the cluster size of cluster ions, the dose, the acceleration voltage for cluster ions, and the beam current.

The cluster size can be set to 2 to 100, preferably 60 or less, more preferably 50 or less. "Cluster size" herein means the number of atoms forming one cluster. The cluster size can be adjusted by controlling the pressure of gas ejected from a nozzle, the pressure of a vacuum vessel, the voltage applied to the filament in the ionization, etc. The cluster size is determined by finding the cluster number distribution by mass spectrometry using the oscillating quadrupole field or by time-of-flight mass spectrometry, and finding the mean value of the number of clusters.

Note however that in this embodiment, for the cluster size of $C_xP_yH_z$, it is more preferred that x be 1 or more and 3 or less, y be 1 or more and 3 or less, and z be 1 or more and 12 or less. The cluster size mentioned above is preferred because a cluster ion beam of small size can easily be controlled. Further, an excessively large number of P atoms speeds up the formation of defects contributing to hydrogen trapping. Accordingly, cluster ions having y/x satisfying 0.5 or more and 2.0 or less with the number of atoms being within the range mentioned above are preferably used.

Figure 2:
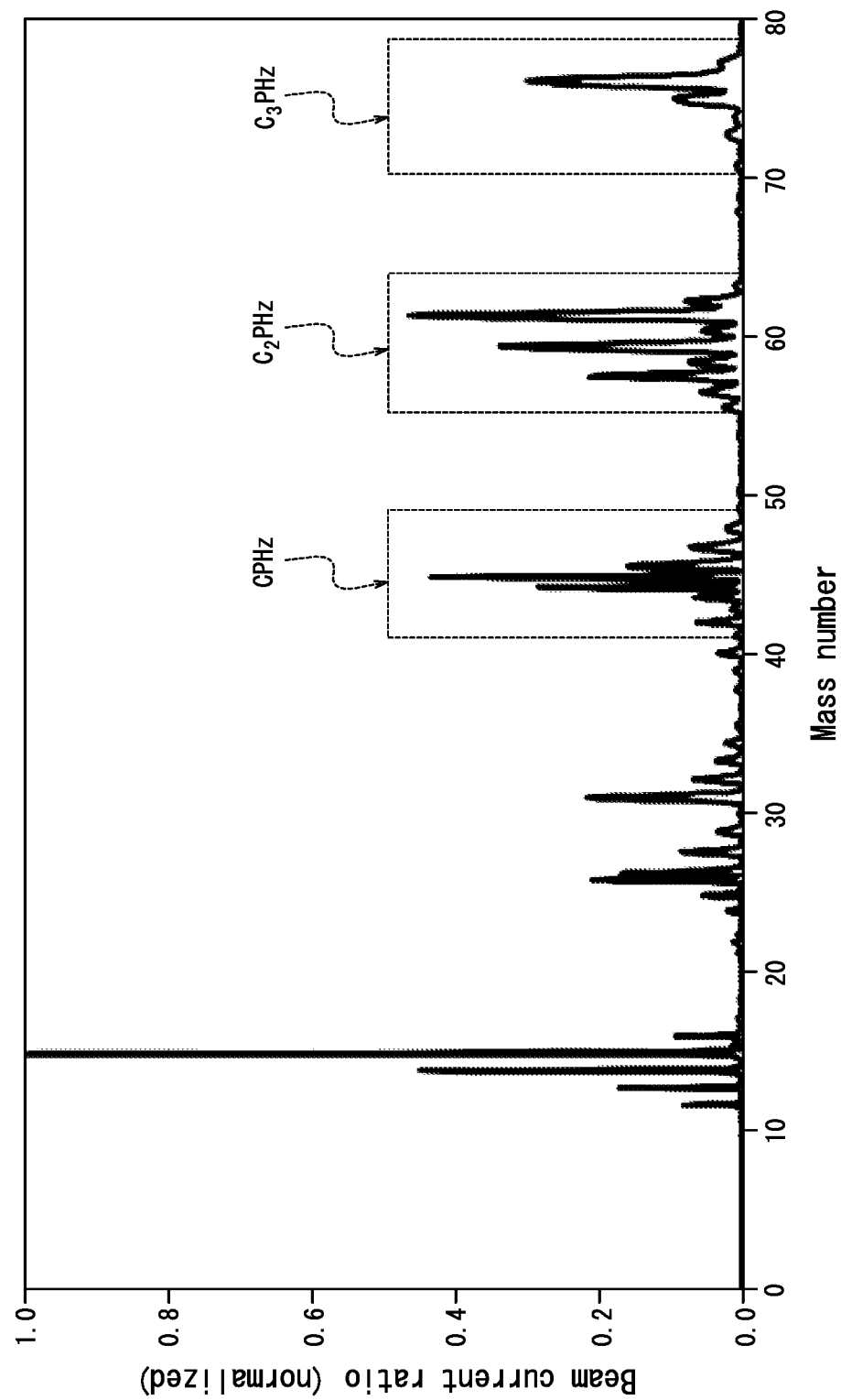
FIG. 2 is a graph illustrating the mass fragments of the cluster ions obtained from trimethylphosphine ($C_3H_9P$) as a source gas.

Gaseous molecules as a source of the cluster ions are not limited as long as cluster ions having the above cluster size can be obtained. Examples of the gaseous molecules include trimethylphosphine ($C_3H_9P$), phosphole ($C_4H_5P$), bis-dimethylphosphinoethane ($C_6H_{16}P_2$), dimethylphosphinopropyl ($C_{15}H_{36}P_4$), triphenylphosphine ($C_{18}H_{15}P$), and diphenylphosphinomethyl ethane ($C_{41}H_{39}P_3$). Note that cluster ions having different sizes can be produced from each of these source gases. For example, as illustrated in FIG. 2, three fragments: $CPH_z$, $C_2PH_z$, and $C_3PH_z$ (z is 1 to 7) can be obtained from trimethylphosphine ($C_3H_9P$). In this embodiment, the surface of the semiconductor wafer is irradiated with cluster ions having y/x of 0.5 or more and 2.0 or less, extracted from the cluster ions of different sizes.

The dose of the cluster ions can be adjusted by controlling the ion irradiation time. The dose of each element forming the cluster ions is determined by the ion species of the cluster ions and the dose of the cluster ions (Cluster/cm$^2$). In this embodiment, the dose of hydrogen is preferably $1\times10^{13}$ atoms/cm$^2$ to $1\times10^{16}$ atoms/cm$^2$, more preferably $5\times10^{13}$ atoms/cm$^2$ or more so that hydrogen remains at a high concentration even after the second step. When the hydrogen dose is less than $1\times10^{13}$ atoms/cm$^2$, hydrogen would diffuse during the formation of the epitaxial layer, whereas a dose exceeding $1\times10^{16}$ atoms/cm$^2$ would cause great damage to the surface of the epitaxial layer 18.

Further, the dose of carbon is preferably $1\times10^{13}$ atoms/cm$^2$ to $1\times10^{17}$ atoms/cm$^2$, more preferably $5\times10^{13}$ atoms/cm$^2$ or more and $5\times10^{16}$ atoms/cm$^2$ or less. When the dose of carbon is less than $1\times10^{13}$ atoms/cm$^2$, sufficient gettering capability might not be obtained, and when the dose of carbon exceeds $1\times10^{16}$ atoms/cm$^2$, the surface 10A of the semiconductor wafer 10 is greatly damaged and a large number of defects would be formed in the surface of the epitaxial layer 18 in the second step.

The dose of phosphorus is 0.5 times or more to 2.0 times or less the dose of carbon, since y/x is 0.5 or more and 2.0 or less.

The acceleration voltage for the cluster ions, in combination with the cluster size, influences the peak position of the concentration profile of a constituent element in the depth direction in the modified layer. In this embodiment, the acceleration voltage for the cluster ions can be set to higher than 0 keV/Cluster and lower than 200 keV/Cluster, preferably 100 keV/Cluster or less, more preferably 80 keV/Cluster or less. The acceleration voltage is typically controlled using two methods: (1) electrostatic acceleration and (2) radiofrequency acceleration. Examples of the former method include a method in which a plurality of electrodes are arranged at regular intervals, and the same voltage is applied between the electrodes so that a constant acceleration field is formed in an axial direction. Examples of the latter method include a linear accelerator (linac) method in which ions are caused to travel along a straight line while being accelerated by radio waves.

As described above, since hydrogen is a lightweight element, hydrogen ions easily diffuse for example due to heat treatment for forming the epitaxial layer 18 and tend to hardly remain in the semiconductor wafer after the formation of the epitaxial layer. Accordingly, in addition to precipitating hydrogen at a high concentration in a localized region by cluster ion irradiation, the surface 10A of the semiconductor wafer 10 is preferably irradiated with hydrogen ions in a relatively short time with the beam current of the cluster ions 12 being set to 50 μA or more, thereby increasing the damage to the surface layer portion. A beam current of 50 μA or more causes more damage and makes hydrogen easily remain at a high concentration in the surface layer portion of the semiconductor wafer 10 on the epitaxial layer 18 side even after the subsequent formation of the epitaxial layer 18. To this end, the beam current of the cluster ions 12 is preferably set to 100 μA or more, more preferably 300 μA or more. On the other hand, when the beam current is excessively high, epitaxial defects would be excessively formed in the epitaxial layer. Therefore, the beam current is preferably set to 5000 μA or less. The beam current of the cluster ions 12 can be adjusted for example by changing the conditions for the decomposition of the source gas in the ion source.

[Second Step]

The epitaxial layer 18 formed on the modified layer 14 is for example a silicon epitaxial layer and can be formed under typical conditions. For example, a source gas such as dichlorosilane or trichlorosilane can be introduced into a chamber using hydrogen as a carrier gas and the source material can be epitaxially grown on the semiconductor wafer 10 by CVD at a temperature in a range of approximately 1000° C. to 1200° C., although the growth temperature depends also on the source gas to be used. The epitaxial layer 18 preferably has a thickness in a range of 1 µm to 15 µm. When the thickness is less than 1 µm, the resistivity of the epitaxial layer 18 would change due to the out-diffusion of dopants from the semiconductor wafer 10, whereas a thickness exceeding 15 µm would affect the spectral sensitivity characteristics of the solid-state image sensing device.

Figure 3A:
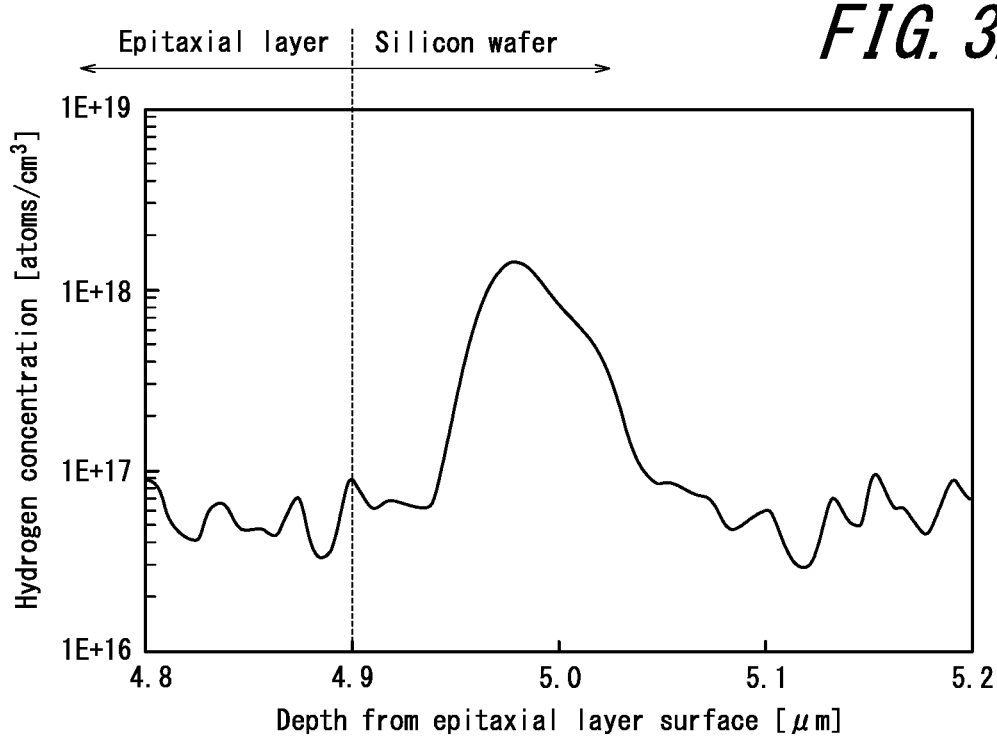
FIG. 3A is a graph illustrating the hydrogen concentration profile of an epitaxial silicon wafer in Experimental Example 1.
Figure 3B:
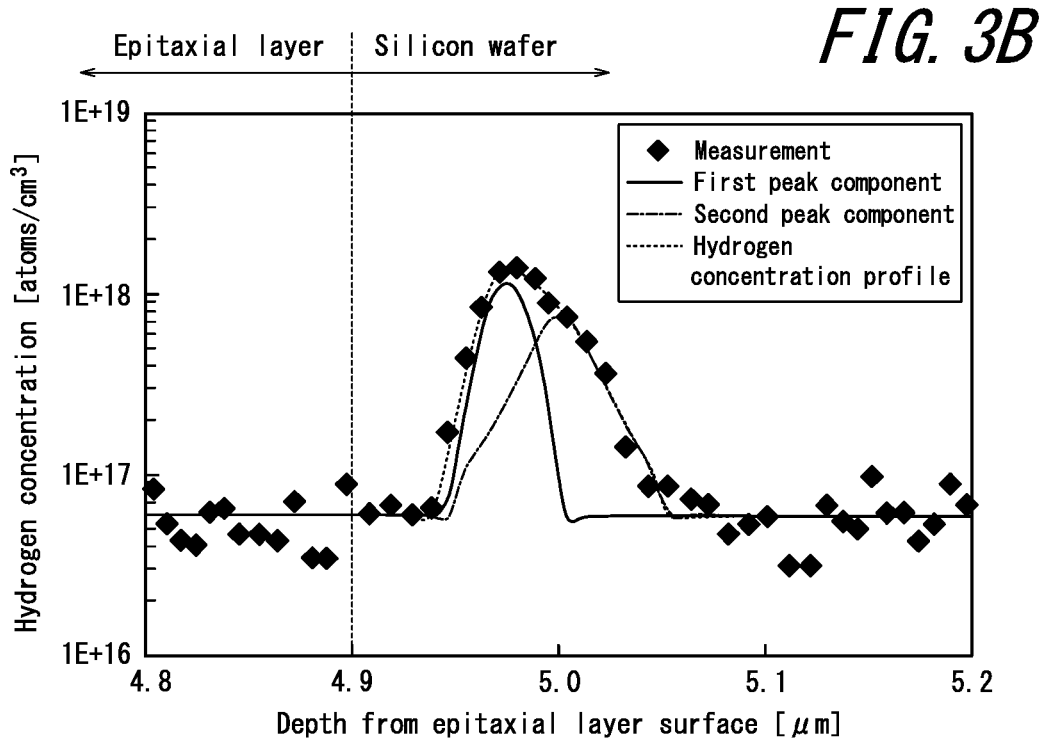
FIG. 3B is a graph obtained by performing peak separation of the hydrogen concentration profile in FIG. 3A.

In the thus obtained semiconductor epitaxial wafer 100, the concentration profile of hydrogen in the depth direction in the modified layer 14 typically has one peak as illustrated in FIG. 3A, and the left side of the peak from the peak position (closer to the interface between the epitaxial layer and the semiconductor wafer) has a shape according to a Gaussian profile, and the right side of the peak from the peak position (farther from the interface between the epitaxial layer and the semiconductor wafer) preferably has a shape having a shoulder expanding outward from the shape according to the Gaussian profile. The hydrogen concentration profile having such a shape can typically be separated into two peaks having a shape according to a Gaussian profile by peak separation using the Lorentzian function as illustrated in FIG. 3B.

The peak concentration of the hydrogen concentration profile before the peak separation is preferably $1.0 \times 10^{17}$ atoms/cm$^3$ or more and $6.0 \times 10^{18}$ atoms/cm$^3$ or less, and the peak width is preferably in a range of 20 nm to 200 nm. Note that the peak width refers to the width of a part of the profile ranging upward from the line of the detection limit of hydrogen being defined as a peak.

The peak concentration of the first peak closer to the interface between the epitaxial layer and the semiconductor wafer after the peak separation is preferably $1.0 \times 10^{17}$ atoms/cm$^3$ or more and $5.0 \times 10^{18}$ atoms/cm$^3$ or less. The peak width of the first peak is preferably in a range of 10 nm to 150 nm.

The peak concentration of the second peak farther from the interface between the epitaxial layer and the semiconductor wafer after the peak separation causes the shoulder portion in the hydrogen concentration profile before the peak separation, and is preferably $1.0 \times 10^{17}$ atoms/cm$^3$ or more and $4.0 \times 10^{18}$ atoms/cm$^3$ or less. The peak width of the second peak is preferably in a range of 10 nm to 150 nm.

Preferably, the peak position of the first peak is in a depth range of 60 nm to 100 nm from the interface between the epitaxial layer and the semiconductor wafer, and the peak position of the second peak is 20 nm to 60 nm deeper than the peak position of the first peak.

It is also preferred that recovery heat treatment for crystallinity recovery be performed on the semiconductor wafer 10 after the first step before the second step. For recovery heat treatment in this case, the semiconductor wafer 10 may be maintained in an atmosphere of for example nitrogen gas or argon gas at a temperature of 900° C. or more and 1100° C. or less for 10 min or more and 60 min or less. Further, the recovery heat treatment may be performed using a rapid heating/cooling apparatus for rapid thermal annealing (RTA), rapid thermal oxidation (RTO), or the like, separate from an epitaxial growth apparatus.

As describe above, in a method of producing a semiconductor epitaxial wafer, according to this embodiment, hydrogen in the form of P—H bonds diffuses in the epitaxial layer even during a low temperature device formation process at for example 400° C. or more and 700° C. or less, and hydrogen in the form of C—H$_2$ bonds diffuses during a high temperature device formation process for example at a temperature exceeding 700° C. Accordingly, the passivation effect of hydrogen in the epitaxial layer, covering device formation processes of a wide temperature range, can be sufficiently obtained.

(Method of Producing Semiconductor Device)

A method of producing a semiconductor device, according to one embodiment of this disclosure includes forming a semiconductor device in the epitaxial layer 18 situated at the surface of the semiconductor epitaxial wafer 100 produced by the producing method described above. According to this producing method, even when the device formation process is performed at a low temperature, the passivation effect of hydrogen in the epitaxial layer can be sufficiently obtained.

EXAMPLES

Experimental Example 1

An n− type silicon wafer obtained from a CZ single crystal silicon ingot (diameter: 300 mm, thickness: 775 µm, dopant: phosphorus, resistivity: 20 Ω·cm) was prepared. Next, CPH$_2$ cluster ions (C$_x$P$_y$H$_z$ where y/x=1.0) were generated and extracted using trimethylphosphine (C$_3$H$_9$P) as a source gas with the use of a cluster ion generating apparatus (CLARIS produced by Nissin Ion Equipment Co., Ltd.; CLARIS is a registered trademark in Japan, other countries, or both), and were shot on the silicon wafer under an irradiation conditions of acceleration voltage: 80 keV/Cluster (acceleration voltage per one hydrogen atom: 1.74 keV/atom, acceleration voltage per one carbon atom: 20.9 keV/atom, acceleration voltage per one phosphorus atom: 53.9 keV/atom). The dose of the cluster ions shot was $1.0 \times 10^{15}$ cluster/cm$^2$. The dose was $2.0 \times 10^{15}$ atoms/cm$^2$ based on the number of hydrogen atoms, $1.0 \times 10^{15}$ atoms/cm$^2$ based on the number of carbon atoms, and $1.0 \times 10^{15}$ atoms/cm$^2$ based on the number of phosphorus atoms. Further, the beam current of the of the cluster ions was set to 550 µA.

Subsequently, the silicon wafer having been irradiated with the cluster ions was transferred into a single-wafer processing epitaxial growth apparatus (produced by Applied Materials, Inc.) and subjected to hydrogen bake-out at a temperature of 1120° C. for 30 s in the apparatus using hydrogen as a carrier gas, trichlorosilane as a source gas, followed by CVD at 1120° C., thereby epitaxially growing a silicon epitaxial layer (thickness: 4.9 µm, dopant: phosphorus, resistivity: 10 Ω·cm) on a surface of the silicon wafer, on which the modified layer was formed. Thus, an epitaxial silicon wafer was obtained.

[Hydrogen Concentration Profile Evaluation Using SIMS]

The epitaxial silicon wafer obtained under the above production conditions was subjected to the measurements of the concentration profiles of carbon, phosphorus, and hydrogen in the depth direction from the silicon epitaxial layer surface by SIMS measurements. Consequently, the modified layer was located in the surface layer portion of 120 nm (that is, 120 nm from the interface between the silicon epitaxial layer and the silicon wafer) of the silicon wafer.

FIG. 3A presents the obtained hydrogen concentration profile. As seen in FIG. 3A, the hydrogen concentration profile had one peak, and the left side of the peak from the peak position had a shape according to a Gaussian profile, and the right side of the peak from the peak position had a shape having a shoulder expanding outward from the shape according to a Gaussian profile. The peak concentration was $1.8 \times 10^{18}$ atoms/cm$^3$, and the peak width was 110 nm. As seen in FIG. 3B, this hydrogen concentration profile was successfully separated by peak separation using the Lorentzian function into two peaks having a shape according to a Gaussian profile. The peak concentration of the first peak closer to the interface between the epitaxial layer and the semiconductor wafer was $1.2 \times 10^{18}$ atoms/cm$^3$, and the peak width of the first peak was 50 nm. The peak concentration of the second peak farther from the interface between the epitaxial layer and the semiconductor wafer was $8.2 \times 10^{17}$ atoms/cm$^3$, and the peak width of the second peak was 100 nm. The peak position of the first peak was at a depth of 80 nm from the interface between the epitaxial layer and the semiconductor wafer, and the peak position of the second peak was at a depth 30 nm deeper than the peak position of the first peak.

Figure 4A:
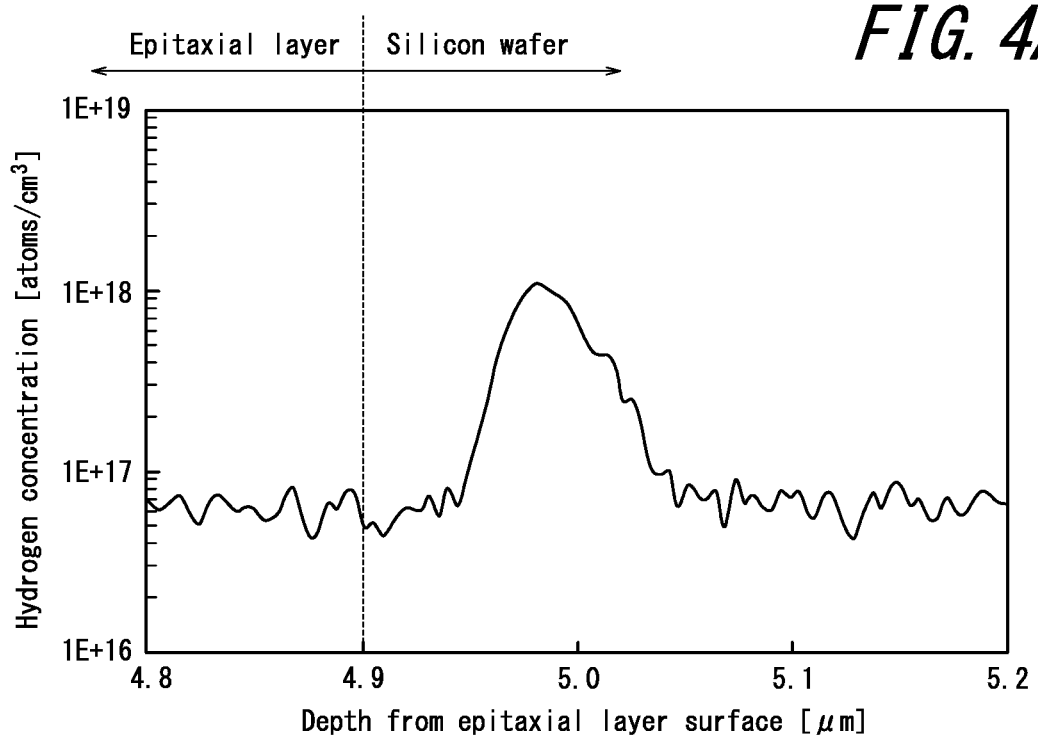
FIG. 4A is a graph illustrating the hydrogen concentration profile of an epitaxial silicon wafer having been subjected to heat treatment at 700° C. for 30 min in Experimental Example 1.
Figure 4B:
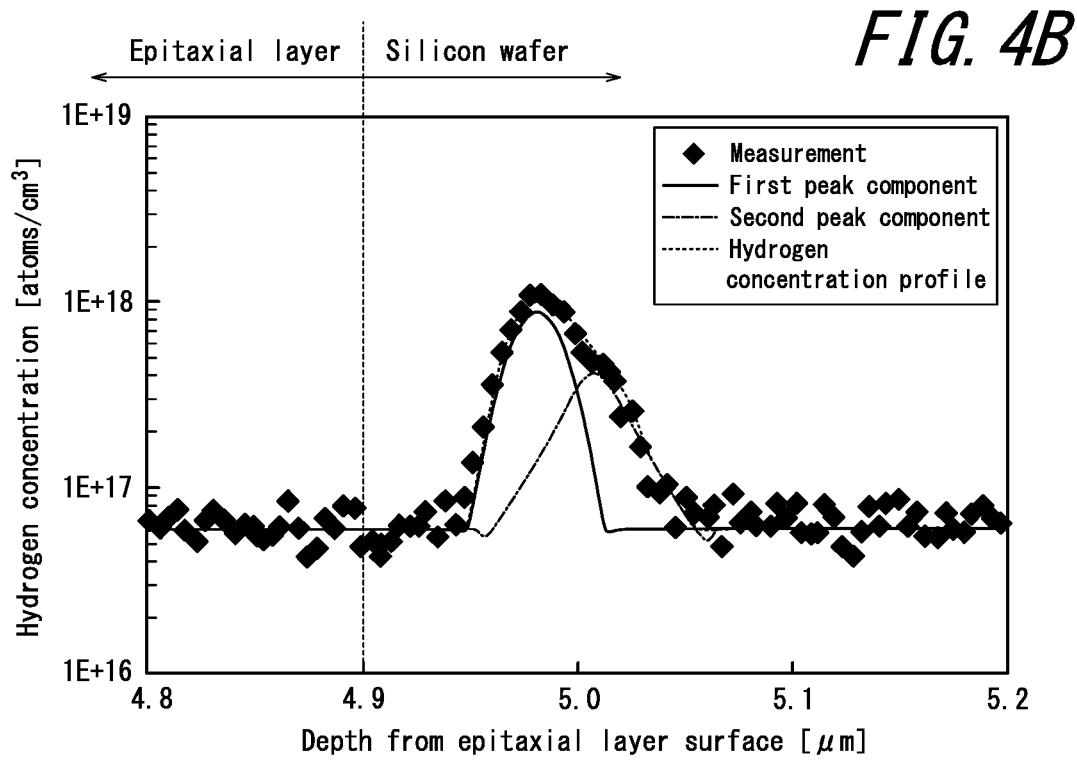
FIG. 4B is a graph obtained by performing peak separation of the hydrogen concentration profile in FIG. 4A.

Next, the epitaxial silicon wafer obtained under the above production conditions was subjected to heat treatment in a nitrogen atmosphere at 700° C. for 30 min, and the hydrogen concentration profile of the wafer was then measured in a like manner. FIG. 4A presents the obtained hydrogen concentration profile. As seen in FIG. 4B, this hydrogen concentration profile was also successfully separated by peak separation using the Lorentzian function into two peaks having a shape according to the Gaussian profile. The peak concentration of the first peak was $9.8 \times 10^{17}$ atoms/cm$^3$, and the peak concentration of the second peak was $4.4 \times 10^{17}$ atoms/cm$^3$. Consequently, the peak concentration of the first peak was reduced by the heat treatment to only 82%, whereas the peak concentration of the second peak was reduced by the heat treatment to 53%.

Figure 5A:
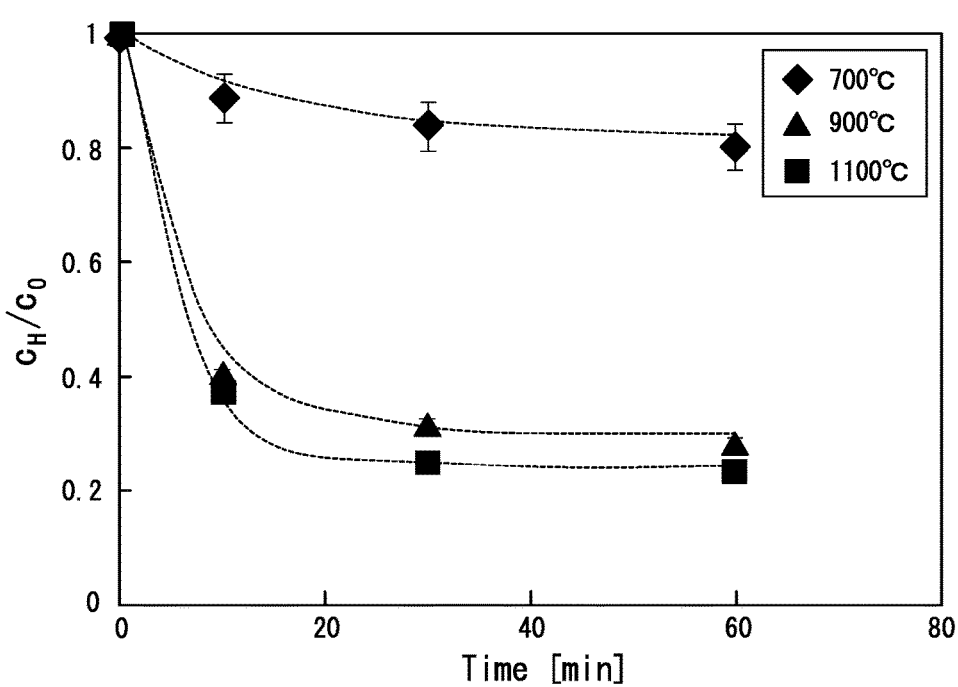
FIG. 5A is a graph illustrating the reduction in the peak concentration of the first peak component of epitaxial silicon wafers having been subjected to heat treatment at different temperatures for different time periods in Experimental Example 1.
Figure 5B:
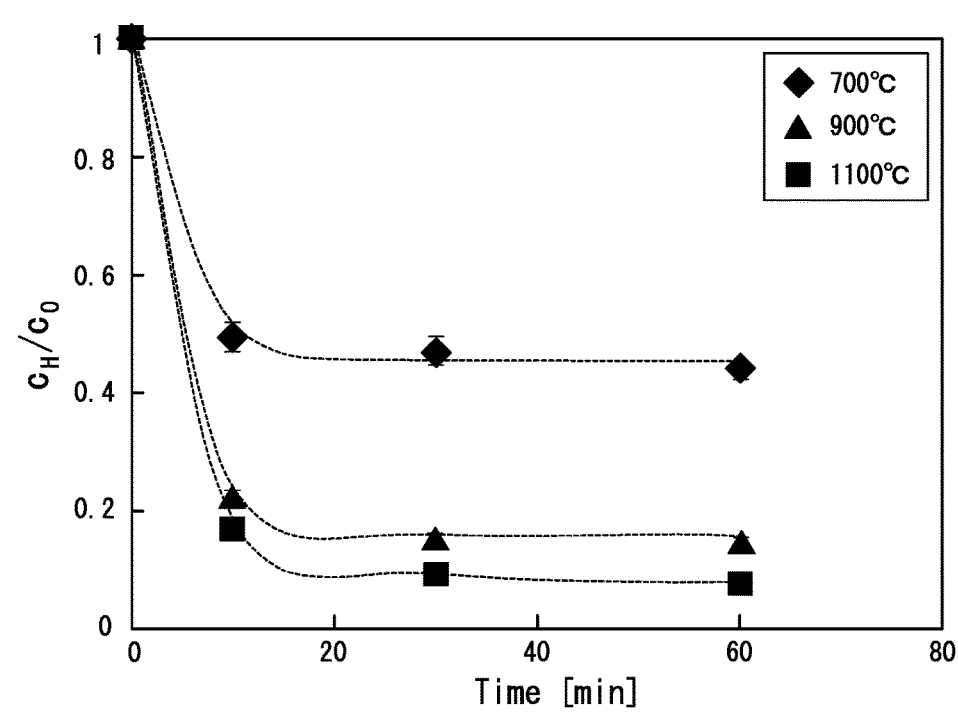
FIG. 5B is a graph illustrating the reduction in the peak concentration of the second peak component of epitaxial silicon wafers having been subjected to heat treatment at different temperatures for different time periods in Experimental Example 1.

In light of this, epitaxial silicon wafers obtained under the above production conditions were subjected to heat treatments in a nitrogen atmosphere at heat treatment temperatures of 700° C., 900° C., and 1100° C. for a heat treatment time of 10 min, 30 min, or 60 min for each temperature, and the hydrogen concentration profiles were then measured by SIMS in a like manner. Subsequently, the first peak and the second peak mentioned above were subjected to peak separation, and the rate of reduction in the peak concentration of each peak was determined. The result for the first peak is presented in FIG. 5A, and the result for the second peak is presented in FIG. 5B. Note that the ratio $C_H/C_0$ of $C_H$ with respect to $C_0$ is used as the reduction rate of the peak concentration of each peak, where the hydrogen peak concentration before heat treatment is expressed as $C_0$ and the hydrogen peak concentration after heat treatment is expressed as $C_H$. As seen in FIG. 5A, the peak concentration of the first peak was greatly reduced in the cases where the heat treatment temperature was 900° C. and 1100° C., whereas the peak concentration was reduced by only a little less than 20% when the heat treatment temperature was 700° C., even though the heat treatment time was 60 min. This demonstrates that most of hydrogen forming the first peak diffused in the epitaxial layer in the heat treatments at 900° C. and 1100° C., but the diffusion of hydrogen into the epitaxial layer in the heat treatment at 700° C. was insufficient. On the other hand, as seen in FIG. 5B, the peak concentration of the second peak was reduced by as much as approximately 50% in heat treatment for only 10 min, even though the heat treatment temperature was 700° C. This demonstrates that the diffusion of the hydrogen forming the second peak into the epitaxial layer was sufficient even in the case of heat treatment at 700° C. Accordingly, the hydrogen desorption reaction rate of the hydrogen forming the second peak is considered to be higher than that of the hydrogen forming the first peak.

To determine the activation energy for hydrogen desorption, the following reaction model was assumed. For hydrogen of each peak, a reaction rate equation (1) representing hydrogen desorption and hydrogen adsorption (trapping) that is the reverse reaction was assumed.

$$\frac{d[H_D]}{dt} = -k_1[H_D] + k_2[H], \quad (1)$$

where $[H_D]$ represents the concentration of hydrogen adsorbed in the modified layer, $[H]$ represents the concentration of hydrogen desorbed and diffused from the modified layer, $k_1$ represents the rate constant of the hydrogen desorption reaction, and $k_2$ represents the rate constant of the hydrogen adsorption reaction. Here, t means time.

In the above Equation (1), assuming that $[H_D]=C_0$ and $[H]=0$ under an initial condition (t=0), and $[H_D]=C_H$ after heat treatment; the ratio of $C_0$ with respect to $C_H$ is given by the following Equation (2).

$$\frac{C_H}{C_0} = \frac{k_2 + k_1 \exp[-(k_1 + k_2)t]}{k_1 + k_2} \quad (2)$$

Figure 6A:
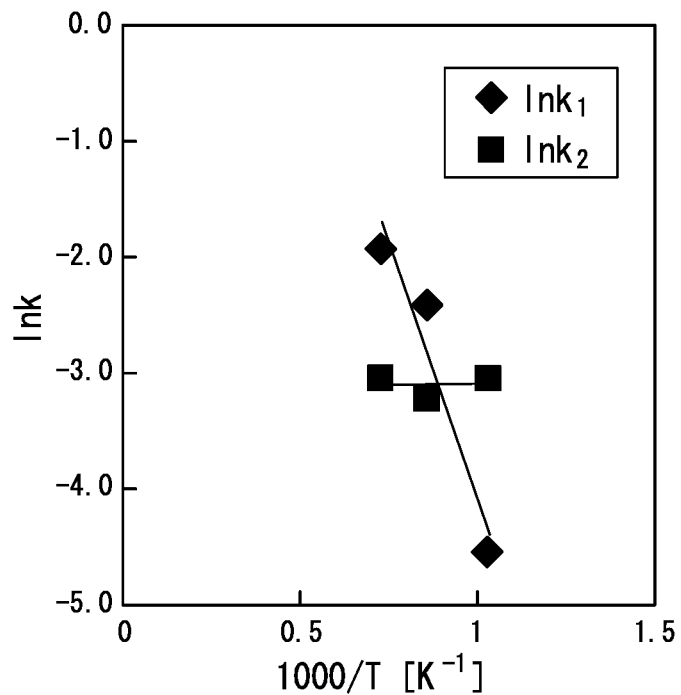
FIG. 6A is a graph illustrating an Arrhenius plot of the first peak component in Experimental Example 1.
Figure 6B:
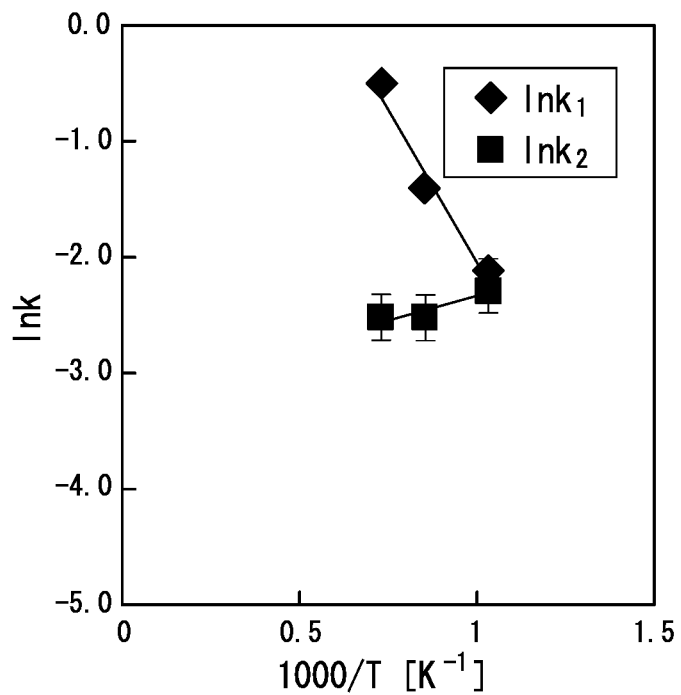
FIG. 6B is a graph illustrating an Arrhenius plot of the second peak component in Experimental Example 1.

Using the results obtained from FIG. 5A and FIG. 5B, Arrhenius plots based on the Arrhenius equation (k=exp($-E_a/k_B T$); k is the reaction rate constant, $E_a$ is the activation energy, $k_B$ is the Boltzmann constant, T is the heat treatment temperature) were created. The results are given in FIG. 6A and FIG. 6B. As a result of data fitting, based on FIG. 6A, the activation energy of hydrogen desorption of the first peak was 0.77 eV, and the activation energy of hydrogen adsorption was 0.008 eV. Further, based on FIG. 6B, the activation energy of hydrogen desorption of the first peak was 0.47 eV, and the activation energy of hydrogen adsorption was 0.016 eV.

The activation energy of hydrogen desorption of the first peak: 0.77 eV was almost the same as the bonding energy of C—H$_2$ bonds: 0.80 eV, so that the hydrogen forming the first peak is assumed to have been hydrogen in the form of C—H$_2$ bonds. Further, since the elements present in the modified layer were carbon, phosphorus, hydrogen, and silicon; possible bonds that hydrogen formed further include P—H bonds. The bonding energy of P—H bonds was 0.3 eV to 0.4 eV. The P—H bonds were dissociated to form atomic hydrogen. The activation energy of the diffusion of atomic hydrogen: 0.48 eV was almost the same as the activation energy of hydrogen desorption of the second peak: 0.47 eV. Thus, the hydrogen forming the second peak is considered to have been hydrogen in the form of P—H bonds. Further, since the hydrogen forming the second peak is desorbed with a lower energy than the hydrogen forming the first peak, the former hydrogen can be desorbed at a lower heat treatment temperature to be diffused into the epitaxial layer.

Experimental Example 2

In Experimental Example 1, the silicon wafer was irradiated with CPH$_2$ cluster ions generated and extracted using trimethylphosphine (C$_3$H$_9$P) as a source gas, whereas in this Experimental Example 2, different kinds of cluster ions were generated from the different source gases given in Table 1 and shot on the silicon wafer. As in Experimental Example 1, the acceleration voltage was set to 80 keV/Cluster, the dose was set to $1.0 \times 10^{15}$ cluster/cm$^2$, and the beam current of the cluster ions was set to 550 μA. Subsequently, silicon epitaxial layers were formed under the same conditions as in Experimental Example 1 to obtain epitaxial silicon wafers. Note that the conditions for cluster ions in Experimental Example 1 correspond to No. 1 in Table 1.

TABLE 1

| | Cluster ion conditions | | | Evaluation | | |
|---|---|---|---|---|---|---|
| No. | Source gas | Cluster ion species $C_xP_yH_z$ | y/x | Presence of dislocation loops observed by TEM | Amount of hydrogen diffusion in low temperature heat treatment, 700° C., 30 min (atoms/cm$^2$) | Type |
| 1 | $C_3H_9P$ | $CPH_2$ | 1.0 | no | $1.3 \times 10^{12}$ | Example |
| 2 | $C_3H_9P$ | $C_2PH_2$ | 0.5 | no | $6.2 \times 10^{11}$ | Example |
| 3 | $C_3H_9P$ | CPH | 0.3 | no | $9.1 \times 10^{9}$ | Comparative Example |
| 4 | $C_6H_{16}P_2$ | $CP_2H_2$ | 2.0 | no | $3.1 \times 10^{13}$ | Example |
| 5 | $C_{15}H_{36}P_4$ | $CP_3H$ | 3.0 | yes | $8.2 \times 10^{9}$ | Comparative Example |
| 6 | $C_3H_9P$ | CPH | 1.0 | no | $1.5 \times 10^{12}$ | Example |
| 7 | $C_3H_9P$ | CPH | 1.0 | no | $2.3 \times 10^{12}$ | Example |

[Evaluation of Presence of Dislocation Loops by TEM Observation]

Figure 7A:
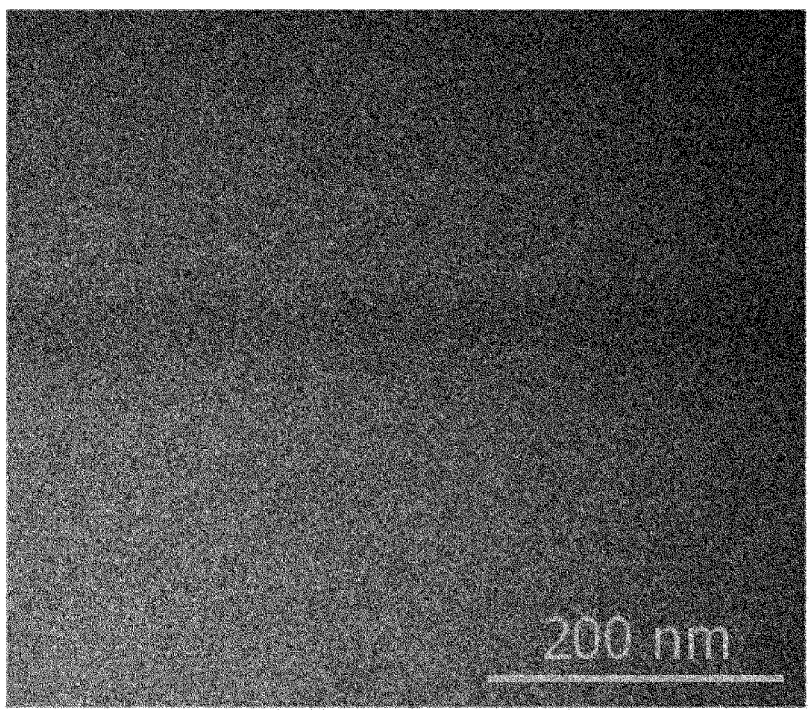
FIG. 7A is a cross-sectional TEM image of the vicinity of the interface between a silicon wafer and a silicon epitaxial layer of an epitaxial silicon wafer in No. 1 (Example) of Experimental Example 2.
Figure 7B:
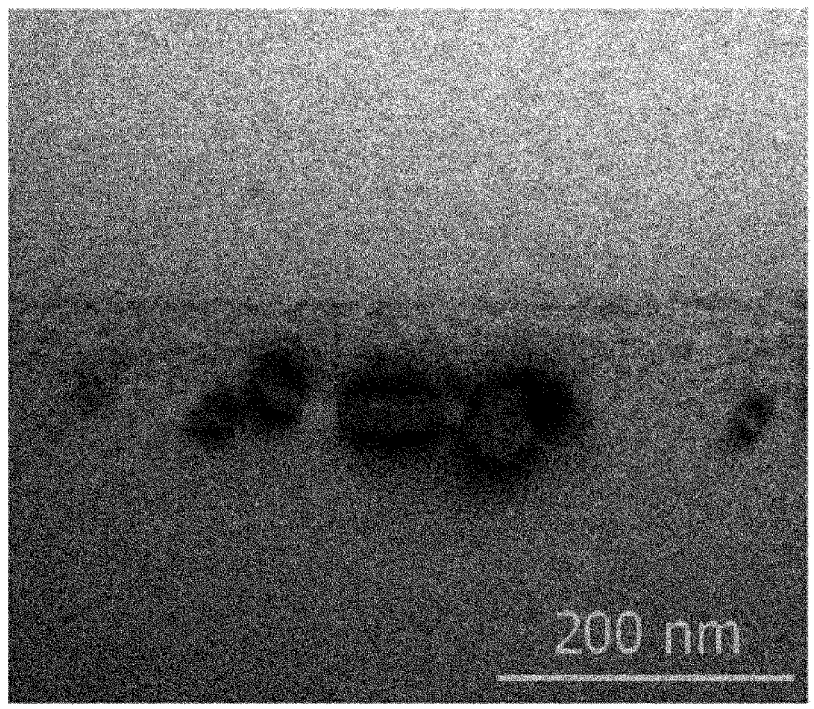
FIG. 7B is a cross-sectional TEM image of the vicinity of the interface between a silicon wafer and a silicon epitaxial layer of an epitaxial silicon wafer in No. 5 (Comparative Example) of Experimental Example 2.

For epitaxial silicon wafers obtained under individual sets of conditions, a cross section in the area of the modified layer was observed under a transmission electron microscope (TEM). As representatives, a cross-sectional TEM image of No. 1 (Example) is presented in FIG. 7A, and a cross-sectional TEM image of No. 5 (Comparative Example) is presented in FIG. 7B. As seen in FIG. 7B, in No. 5 in which y/x was 3.0, dislocation loops that seem to be due to phosphorus were observed to be formed in a relatively deep area in the modified layer. On the other hand, as seen in FIG. 7A, in No. 1 in which y/x was 1.0, no such dislocation loop was observed. Likewise, no dislocation loop was observed in the wafers under the other sets of conditions. The results are arranged in Table 1.

[Evaluation of Amount of Hydrogen Diffusion in Low Temperature Heat Treatment]

The amount of hydrogen diffusion in low temperature heat treatment was evaluated using the amount of reduction in the peak area of the second peak of the epitaxial silicon wafer having been subjected to heat treatment at 700° C. for 30 min, which was a low temperature heat treatment. The amount of reduction was found in the following manner. The area enclosed by the curve of the second peak before heat treatment at 700° C. for 30 min and the detection limit line ($7.0 \times 10^{16}$ atoms/cm$^3$) of SIMS measurement was determined as a peak area A. After that, the area enclosed by the curve of the second peak after the heat treatment at 700° C. for 30 min and the detection limit line was determined as a peak area B. The value obtained by subtracting the area B from the area A was determined as the amount of hydrogen diffusion in low temperature heat treatment. The interface state density at the interface between Si (100) and SiO$_2$ is $1.0 \times 10^{10}$ atoms/cm$^2$ to $1.0 \times 10^{11}$ atoms/cm$^2$. Accordingly, when the amount of hydrogen diffusion in the low temperature heat treatment is $1.0 \times 10^{10}$ atoms/cm$^2$ or less, it may be that the passivation effect in the device process cannot be expected to be obtained. In light of this, the criterion for evaluating the amount of hydrogen diffusion in low heat treatment was set to $1.0 \times 10^{10}$ atoms/cm$^2$.

As is clear from Table 1, in Examples using cluster ions having y/x of 0.5 or more and 2.0 or less, the amount of hydrogen diffusion in low temperature heat treatment was large, whereas in Comparative Examples in which y/x was less than 0.5 or more than 2.0, the amount of hydrogen diffusion in low temperature heat treatment was not sufficient.

INDUSTRIAL APPLICABILITY

The method of producing a semiconductor epitaxial wafer, according to this disclosure produces a semiconductor epitaxial wafer allowing for a sufficient passivation effect of hydrogen in an epitaxial layer even when the semiconductor epitaxial wafer is subjected to a low temperature device formation process.

REFERENCE SIGNS LIST

100: Semiconductor epitaxial wafer
10: Semiconductor wafer
10A: Surface of semiconductor wafer
12: Cluster ion
14: Modified layer
18: Epitaxial layer

The invention claimed is:

1. A method of producing a semiconductor epitaxial wafer, the method comprising:
   irradiating a surface of a semiconductor wafer with cluster ions containing carbon, phosphorus, and hydrogen as constituent elements to form a modified layer that is located in a surface layer portion of the semiconductor wafer and that contains the constituent elements of the cluster ions as a solid solution; and
   forming an epitaxial layer on the modified layer of the semiconductor wafer,
   wherein a ratio y/x of the number y of the phosphorus atoms with respect to the number x of the carbon atoms satisfies 0.5 or more and 2.0 or less, where the number of atoms of carbon, phosphorus, and hydrogen in the cluster ions is expressed by $C_xP_yH_z$ where x, y, and z are integers each equal to or more than 1.

2. The method of producing a semiconductor epitaxial wafer, according to claim 1, wherein x is 1 or more and 3 or less, y is 1 or more and 3 or less, and z is 1 or more and 12 or less.

3. The method of producing a semiconductor epitaxial wafer, according to claim 1, wherein in the irradiating, a beam current of the cluster ions is 50 μA or more and 5000 μA or less.

4. The method of producing a semiconductor epitaxial wafer, according to claim 1, wherein the semiconductor wafer is a silicon wafer.

5. A method of producing a semiconductor device, the method comprising forming a semiconductor device in the epitaxial layer of the semiconductor epitaxial wafer produced by the producing method according to claim 1.

* * * * *